US006731553B2

United States Patent
Fujioka et al.

(10) Patent No.: US 6,731,553 B2
(45) Date of Patent: May 4, 2004

(54) MEMORY CIRCUIT HAVING COMPRESSED TESTING FUNCTION

(75) Inventors: Shinya Fujioka, Kawasaki (JP);
Waichiro Fujieda, Kawasaki (JP);
Kota Hara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 39 days.

(21) Appl. No.: 10/270,196

(22) Filed: Oct. 15, 2002

(65) Prior Publication Data

US 2003/0099143 A1 May 29, 2003

(30) Foreign Application Priority Data

Nov. 29, 2001 (JP) .......................................... 2001-363871

(51) Int. Cl.[7] ................................................. G11C 7/00
(52) U.S. Cl. ............. 365/201; 365/185.19; 365/185.09; 365/210; 365/200; 365/49
(58) Field of Search ............................ 365/201, 185.19, 365/185.09, 210, 200, 49

(56) References Cited

U.S. PATENT DOCUMENTS 5,652,725 A * 7/1997 Suma et al. ................. 365/200
5,793,685 A * 8/1998 Suma .......................... 365/201
6,324,087 B1 * 11/2001 Pereira ......................... 365/49

FOREIGN PATENT DOCUMENTS

JP 04-328399 11/2002

* cited by examiner

*Primary Examiner*—Connie C. Yoha
(74) *Attorney, Agent, or Firm*—Arent Fox PLLC

(57) ABSTRACT

A multi-bit output configuration memory circuit comprises: a memory core having a normal cell array and a redundant cell array, which have a plurality of memory cells; N output terminals which respectively output N-bit output read out from the memory core; an output circuit provided between the output terminals and the memory core, which detects whether each L-bit output of the N-bit output (N=L×M) read out from said memory core matches or not and outputs a compressed output which becomes the output data in the event of a match while becomes a third state in the event of a non-match, to a first output terminal of the N output terminals. Responding to each of a plurality of test commands or the test control signals of the external terminals, the compressed output of the M groups of L-bit output is outputted in time shared.

12 Claims, 9 Drawing Sheets

OVERALL CONFIGURATION

FIRST EMBODIMENT

OUTPUT ACTIVIATION CONTROL CIRCUIT A

OUTPUT ACTIVIATION CONTROL CIRCUIT B

OUTPUT CONTROL CIRCUIT 01

OUTPUT CONTROL CIRCUIT 02, 03, 04

OUTPUT ACTIVIATION CONTROL CIRCUIT A

OUTPUT ACTIVIATION CONTROL CIRCUIT B

|        | NORMAL READ | READ IN TEST | OTHER THAN READ |
|--------|-------------|--------------|-----------------|
| poex   | L           | L            | H               |
| tes1z  | L           | H            | –               |
| oex    | L           | H            | H               |
| DQ2-4  | cdb2-4      | Hz           | Hz              |

OUTPUT CONTROL CIRCUIT 01

MEMORY CIRCUIT HAVING COMPRESSED TESTING FUNCTION

BACKGROUND OF THE INVENTION

1. Field of the Invention

The present invention relates to a memory circuit having a compressed testing function, and more particularly to a memory circuit which, lowering the test compression ratio, can increase the salvage ratio of defective cells and increase the simultaneous measurement factor of test equipment.

2. Description of the Related Art

Recently, the trend in semiconductor memories incorporated in portable information terminals, etc. has been toward increasingly large capacity, due to such factors as the storage of image data. As a result, testing time of these memory circuits with increased capacity has tended to become longer, and demand for memory circuits with shorter test time has appeared.

In testing large capacity memory circuits, simultaneous measurement is performed on a plurality of memory chips, connected in parallel to the test equipment. In order to measure simultaneously even more memory chips, even in the face of the limited number of probes built into the test equipment, the output of the memory chips is compressed and a reduction is made in the number of outputs from each. For example, in memory chips with 16-bit output, during test operation, the 16-bit output is compressed by $1/16^{th}$ and made into a 1-bit output. In this way, it is possible to measure simultaneously a number of memory chips equal to the number of probes of the test equipment and the test time required for each chip can be reduced to $1/16^{th}$.

However, for large capacity memory circuits, it is necessary to provide redundant memory cells and make a configuration that can salvage defective bits. When the compression ratio during testing is increased, in the case that defective bits are discovered it is necessary to replace with redundant memory a number of memory cells corresponding to the compression ratio. For example, if the test compression ratio is $1/16^{th}$, in the case that a defective bit is discovered, it is not clear which bit of the 16 bits subject to compression is the defective one and as a result, all of the 16 bits of memory cells must be replaced with redundant cells. Consequently, when compression ratio is increased during testing, it may invite the problem that the rate of salvaging defective cells decreases.

As indicated above, what is required is to shorten testing time while also preventing any reduction in the salvage ratio of defective cells. In other words, what is required is to make the compression ratio during testing as low as possible and further to make the number of memory chips which can be simultaneously measured during testing as large as possible.

SUMMARY OF THE INVENTION

To address this, an object of the present invention is to provide a memory chip which keeps the output bit compression ratio during testing as low as possible and enables the output of compressed data from as few output terminals as possible.

In order to achieve the above-indicated object, one aspect of the present invention is to provide a multi-bit output configuration memory circuit comprising: a memory core having a normal cell array and a redundant cell array, which have a plurality of memory cells; N output terminals which respectively output N-bit output read out from the memory core; an output circuit provided between the output terminals and the memory core, which detects whether each L-bit output of the N-bit output (N=L×M) read out from said memory core matches or not and outputs a compressed output which becomes the output data in the event of a match while becomes a third state in the event of a non-match, to a first output terminal of the N output terminals.

Responding to each of a plurality of test commands, the compressed output of the M groups of L-bit output is outputted in time shared. Likewise, responding to the test control signals of the external terminals, which follow a common test command, the compressed output of the M groups of L-bit output is outputted in time shared. In this way, the salvage rate of redundant cells can be increased and the simultaneous measuring factor of the test equipment can be increased.

DESCRIPTION OF THE PREFERRED EMBODIMENTS

Preferred embodiments of the present invention are described below, referring to the figures. However, the scope protected by the present invention is not limited to the below embodiments but extends to the inventions disclosed in the claims and equivalents thereof.

Figure 1:
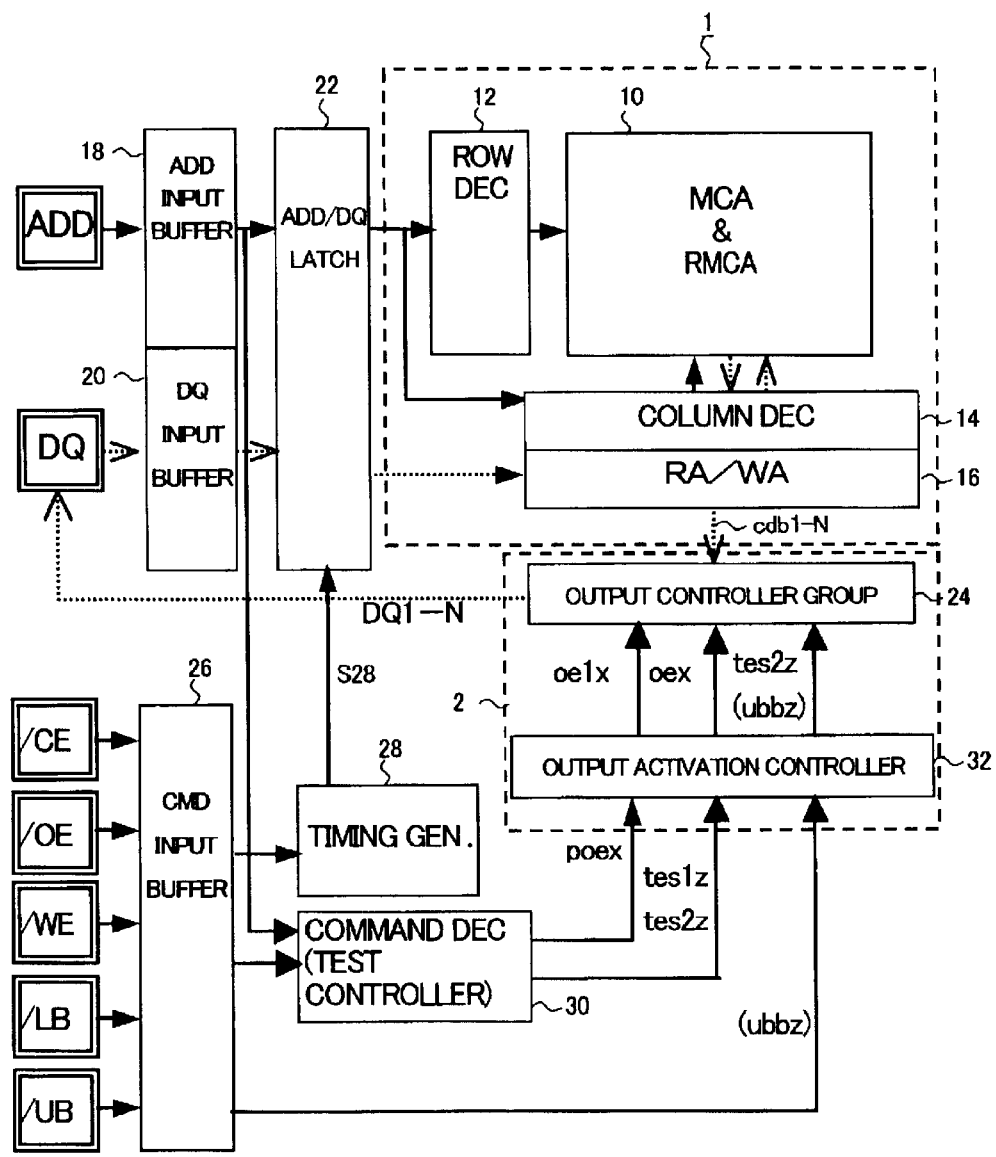
FIG. 1 is an overall configuration drawing of the memory circuit of a preferred embodiment.

FIG. 1 is an overall configuration drawing of the memory circuit of the present embodiment. Memory core 1 of the memory circuit is configured of: cell array 10 which has normal memory cell array MCA, having a plurality of memory cells, and redundant memory cell array RMCA, also having a plurality of memory cells; row decoder array 12 which selects the word line; column decoder bank 14 which selects the bit line; and amplifier array 16 which has a read amplifiers and write amplifiers. Row address, column address, and write data are supplied to memory core 1 and data writing is conducted. In addition, row address and column address are supplied to memory core 1 and data readout is conducted. Although not shown in the figure, in some cases the embodiment may have a more than one memory core 1.

A plurality of multi-bit addresses supplied to address terminal ADD are inputted into address input buffer 18 and input data supplied to a plurality of input/output terminals DQ are inputted into DQ input buffer 20. The addresses and input data are latched in respective latch circuit(s) 22.

Meanwhile, command terminals /CE, /OE, /WE, /LB (Lower Byte), /UB (Upper Byte) are inputted into command input buffer 26 and then inputted into command decoder 30. Command decoder 30 decodes these command signals and the code signals supplied to address terminal ADD and, when performing "read" operations, generates preliminary output enable signal poex and outputs read data at the specified timing. In addition, timing generation circuit 28, decoding the command signal and code signal supplied to address terminal ADD, generates latch control signal S28, etc. at the specified timing.

During normal read operations, output circuit 2, provided externally to memory core 1, simultaneously outputs N-bit output data to input/output terminal DQ. When in the test mode, output circuit 2 outputs compressed output in time shared, which consists of compressed multi-bit output data, from one output terminal or a number of output terminals fewer than N. Output circuit 2 comprises output control circuit group 24 and output activation control circuit 32.

The N-bit data outputted from memory core 1 are outputted to each of N common data buses cdb1 through N and are supplied to each output control circuit in output control circuit group 24. During normal readout operation, responsive to output enable signal oex, the output control circuit 24 outputs N-bit output data simultaneously to N input/output terminals DQ.

Output activation control circuit 32, responsive to preliminary output enable signal poex, supplies output enable signal oex and oe1x to output control circuit group 24 and permits data output of the output control circuit. For operations other than read, preliminary output enable signal poex goes into the state of output disallowed, and output activation control circuit 32 puts the output enable signals oex and oe1x each into a state of output disallowed, so that data output from the output control circuit is prohibited. Specifically, the output of the output control circuit is controlled in a third state, neither H level or L level, but for example, a high impedance state.

In the present embodiment, command decoder 30, responsive to test commands supplied from the outside, generates test control signals tes1z and tes2z. Consequently, command decoder 30 is also a test control circuit which controls the test operation. These test control signals tes1z and tes2z are supplied to output circuit 2.

In addition, for normal operation, output activation control circuit 32 exercises control such that, in respect to read commands, data output of output control circuits 24 is permitted. Then, in the test mode, output activation control circuit 32 supplies output enable signal oe1x to one (or a number less than N) output control circuits of output control circuit group 24, causing output of the compressed output which is the test result.

With the present embodiment, in the test mode, testing time is shortened by performing compressed output. In other words, in the test mode, the N-bit data output outputted from memory core 1, is partitioned into M groups of L-bit data output, each of which is made up of L-bit data output. Therefore, in the case that compressed test output is outputted from one output terminal, the output control circuit provides a time-shared output of M compressed output. By segmented and in time-shared outputting of a plurality of compressed outputs, the number of output terminals for the test mode can be reduced. Moreover, even if the compression ratio is reduced and the compressed output becomes a plurality of bits (M bits), by making that a time shared output, the number of output terminals needed in the test mode can be reduced. As a result, the number of memory chips which can be simultaneously measured by the test equipment can be increased.

Output activation control circuit 32, responsive to the output data of the common data bus cdb1 through N, controls the output of output control circuit 24 to be in H level or L level state or in a third state, for example a high impedance state. This control is performed by means of output enable signal oe1x generated by the activation control circuit 32. Then, in the test mode, output activation control circuit 32 has the function of detecting whether the L bits of data output of each group match or not. If the L bits of data output match, output activation control circuit 32 makes output enable signal oe1x go to the first level and causes that matching level to be outputted by output control circuit 24. On the other hand, in the event that the L bits of data output do not match, output activation control circuit 32 makes output enable signal oe1x go to the second level and controls the output of output control circuit 24 to go to a third state.

If, for example, there are 16 input/output terminals DQ and common data bus cdb is 16 bit, with the present embodiment, in the test mode, each 8 bits of the 16-bit output data are compressed, and 2-bit compressed output is outputted by time sharing. As another example, if each 4 bits of the 16-bit output data are compressed, 4-bit compressed output is outputted by time sharing. In yet another example, if each 2 bits of the 16-bit output data are compressed, 8-bit compressed output is outputted by time sharing. In any of the above-mentioned cases, when in the test mode, multi-bit compressed output is outputted from one (or a number less than N) of the output terminals DQ by time sharing.

First Embodiment

Figure 2:
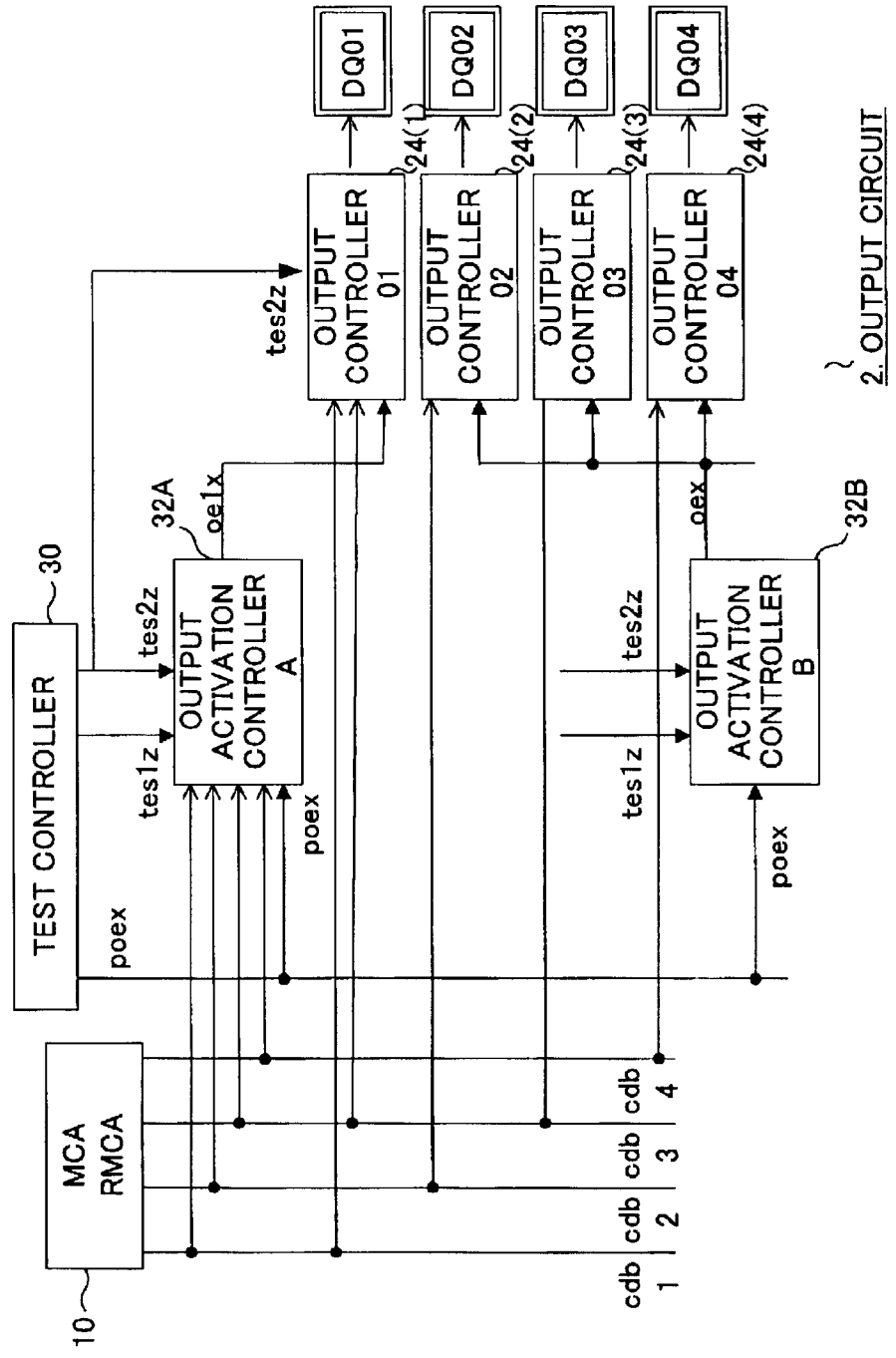
FIG. 2 is a configuration drawing of the output circuit of the first embodiment.
Figure 3:
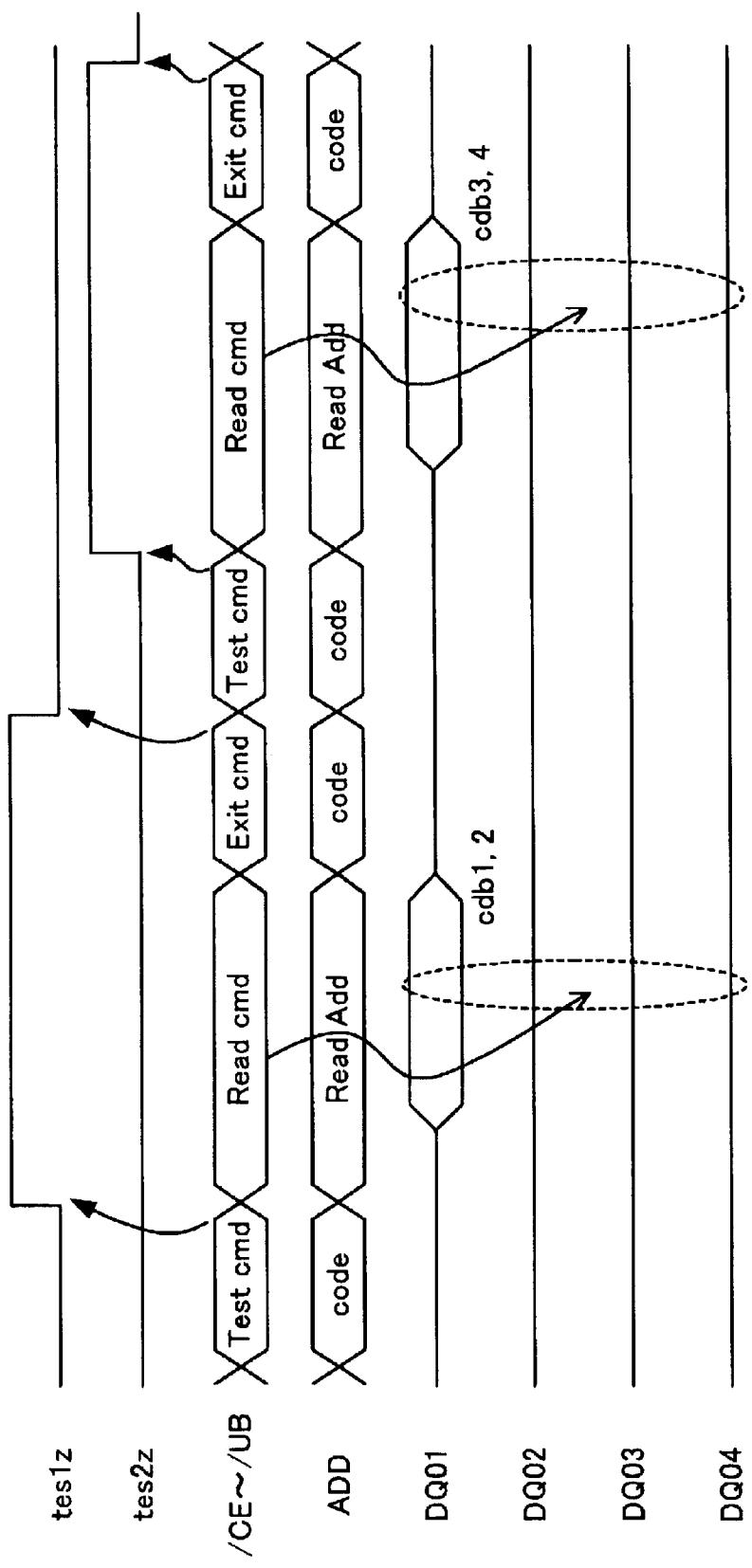
FIG. 3 is a timing chart of the test mode of the first embodiment.

FIG. 2 is a configuration drawing of the output circuit of the first embodiment, while FIG. 3 is a timing chart of the test mode of the first embodiment. In the present embodiment, as an example, in a 4-bit output configuration, in the test mode, 2-bits at a time are handled for compressed testing and the compressed output of two groups is serially outputted from the first of input/output terminals DQ1.

As shown in FIG. 2, from cell array 10 which constitutes the memory core, 4-bit output data is outputted from each of the four common data buses cdb1 through cdb4. The 4-bit data on the common data bus is latched in the readout amplifier RA shown in FIG. 1. In addition, the common data bus is made common to a plurality of memory cores, and the 4-bit output from the selected memory core is outputted to the common data bus.

The four common data buses cdb1 through cdb4 are connected respectively to four output control circuits 24. Additionally, the four output control circuits 24 are connected respectively to four input/output terminals, DQ1 through DQ4. Output circuit 2 has, in addition to output control circuits 24, output activation control circuits 32A and 32B.

Figure 4:
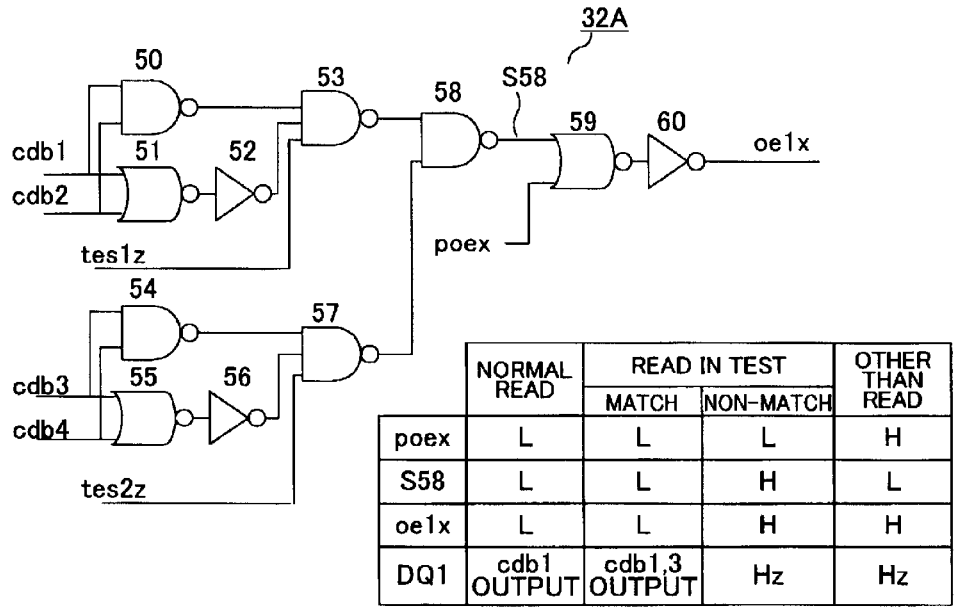
FIG. 4 is a diagram showing an output activation control circuit and its logic value table for the first embodiment.
Figure 5:
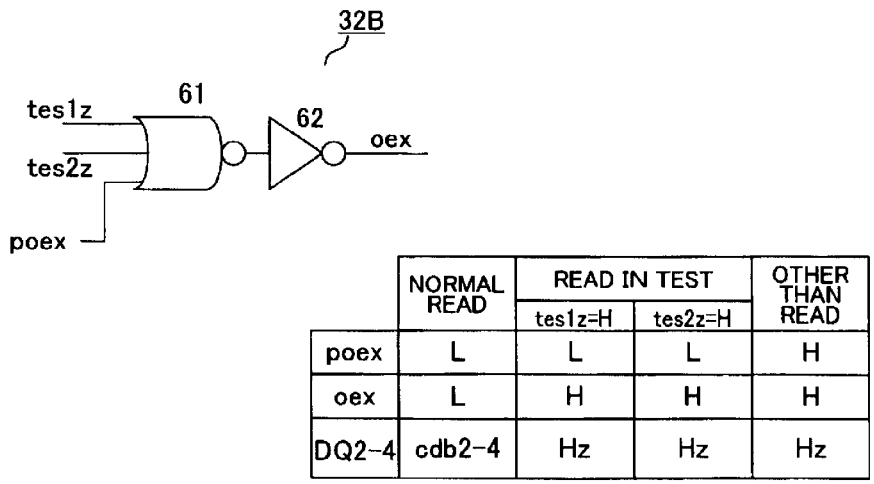
FIG. 5 is a diagram showing an output activation control circuit and its logic value table for the first embodiment.

FIGS. 4 and 5 are diagrams showing the output activation control circuit and its logic value table. During normal read operation, output activation control circuits 32A and 32B, responsive to the active state (L level) of preliminary output enable signal poex which test control circuit 30 outputs in response to read commands, make control output enable signals oe1x and oex go into an active state (L level) and controls output control circuit 24 to go into the output state.

In this way, output control circuit 24 outputs the data of corresponding common data bus cdb1 through cdb4 from corresponding input/output terminals DQ1 through DQ4. When not performing read operations, output activation circuits 32A and 32B put preliminary enable signal poex in the inactive state (H level) and output enable signals oe1x and oex both in the inactive state (H level), and controls outputs DQ1 through DQ4 of output control circuit 24 to be in high impedance state Hz.

Four common data buses cdb1 through cdb4 are supplied to output activation control circuit 32A and, responsive to test control signals tes1z and tes2z, output activation control circuit 32A detects whether or not the 2-bit outputs of common data bus cdb1 and cdb2 match and whether or not the 2-bit outputs of common data bus cdb3 and cdb4 match. Output activation control circuit 32A then outputs the result as output enable signal oe1x. In the event that of a match, output enable signal oe1x is controlled into the active state (L level) and, responsive to that, first output control circuit 24 (1) outputs either common data bus cdb1 or cdb2. In the event of a non-match, output enable signal oe1x is controlled into the inactive state (H level) and, responsive to that, first output control circuit 24 (1) puts output DQ1 into the high impedance state.

Further, in the test mode, output activation control circuit 32B is provided with first and second test control signals tes1z and tes2z and controls output enable signal oex to be in the inactive state (H level). Accompanying this, the remaining output control circuits 24 (2) (3) and (4) control outputs DQ2, 3, and 4 all to be in the high impedance state.

In the output activation control circuit of FIG. 4, gates 50, 51, 52 and 53 constitute an ENOR circuit which, responsive to first test control signal tes1z, detects whether or not the outputs of common data bus cdb1 and cdb2 match. Likewise, gates 54, 55, 56 and 57 constitute an ENOR circuit which, responsive to second test control signal tes2z, detects whether or not the outputs of common data bus cdb3 and cdb4 match. The outputs of these two ENOR circuits are both inputted to NAND gate 58.

When preliminary output enable signal poex is in the active state (L level) and also the output from the ENOR circuits is in the active state (when there is a match, S58 is L level), NOR gate 59 and inverter 60 make output enable signal oe1x go into the active state (L level). As a result, first output control circuit 24 (1) goes into the "output enabled" state. Conversely, when either preliminary output enable signal poex is in the inactive state (H level) or the output from ENOR circuit is in the inactive state (when there is no match, S58 is H level), output enable signal oe1x is made to go into the inactive state (H level). As a result, first output control circuit 24 (1) makes output DQ1 go into the high impedance state.

In the output activation control circuit 32B of FIG. 5, when either preliminary output enable signal poex is in the inactive state (H level) or either first test control signal tes1z or second test control signal tes2z is in the inactive state (H level), NOR gate 61 and inverter 62 make output enable signal oex go into the inactive state (H level). As a result, output terminals DQ2, 3, and 4 all go into a high impedance state. In other words, when in the test mode or non-read mode, output terminals DQ 2, 3 and 4 are controlled to be in the high impedance state.

Figure 6:
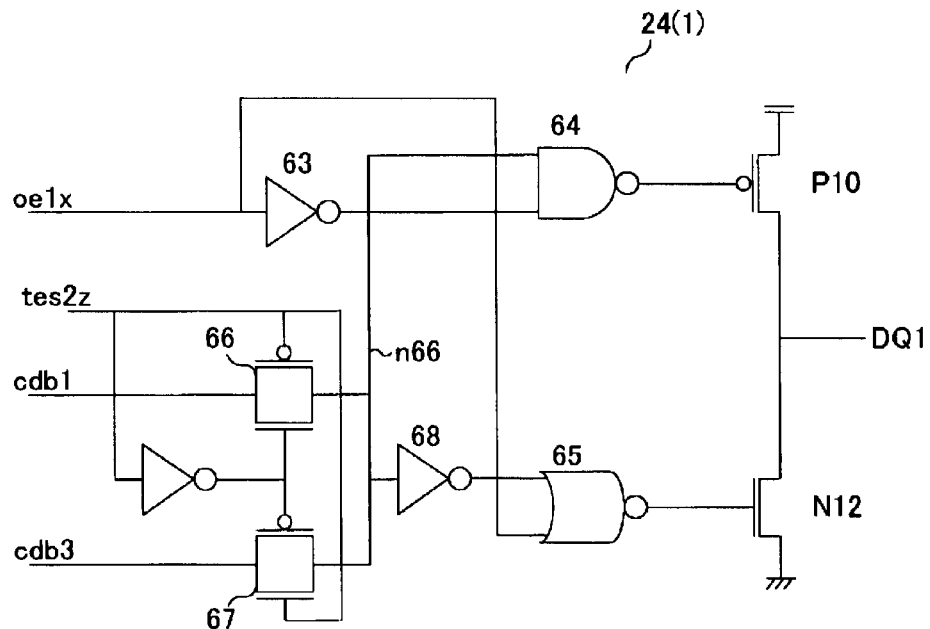
FIG. 6 is a circuit diagram of the output control circuit for the first embodiment.
Figure 7:
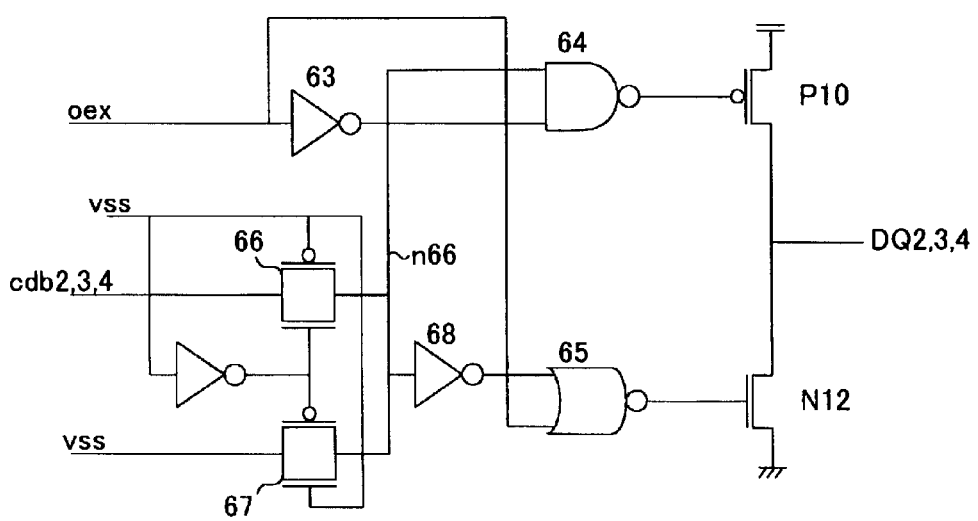
FIG. 7 is a circuit diagram of the output control circuit.

FIG. 6 is a circuit diagram of the first output control circuit, while FIG. 7 is a circuit diagram for the other output control circuits. The configuration of the four output control circuits has P-channel transistor P10 and N-channel transistor N12 and, to control them, NAND gate 64 and NOR gate 65. In the inactive state (H level) of output enable signal oe1x or oex, both transistors P10 and N12 turn off and output terminal DQ is controlled to be at high impedance, while in the active state (L level), transistors P10 and N12 are turned on or off in response to the level of node n66, and output terminal DQ is controlled to be at H level or L level.

At output control circuit 24 (1) of FIG. 6, if, responsive to second test control signal tes2z, either transfer gate 66 or transfer gate 67 opens, one of the common data buses cdb1 or cdb3 is chosen and, responsive to node n66, either an H level or L level will be outputted to output terminal DQ1. On the other hand, at output control circuits 24 (2), (3) or (4) of FIG. 7, if a common data bus cdb2, 3, or 4, corresponding to one of those output control circuits, is selected via transfer gate 66, which is normally in the "on" state, an H level or L level will be outputted to output terminal DQ2, 3, or 4, responsive to that selection.

In the first embodiment, responsive to first and second test commands supplied from outside, test control circuits enter respectively first test mode and second test mode and in those test modes output respectively two compressed outputs. Upon outputting of their respective compressed outputs, the test control circuits exit from their respective test modes, responsive to an exit command.

As shown in FIG. 3, supplying first test command to command terminal group /CE through /UB and supplying a test code to the address terminal group ADD, test control circuit 30 which is a command decoder detects first test mode and sets first test control signal tes1z to H level. As a result, the memory circuit enters first test mode.

After the memory circuit enters first test mode, upon being supplied a read command from outside, 4-bit data from the cell array inside the memory core is outputted to the common data bus. Then, responsive to an H level of first test control signal tes1z, output activation control circuit 32A detects whether or not the outputs of common data buses cdb1 and cdb2 match. If they match, output enable signal oe1x is set to the active state (L level), while if they do not match, it is set to the inactive state (H level). In the case of a match, the output of command data bus cdb1 selected by first test control signal tes1z is outputted from the first input/output terminal DQ1. In the case of a non-match, first input/output terminal DQ1 goes into the high impedance state. As a result, compressed output is outputted to first input/output terminal DQ1.

When the first test mode finishes, an exit command is supplied from outside, whereupon test control circuit 30 sets first test control signal tes1z to L level. In addition, a second test command is supplied from outside, whereupon test control circuit 30 detects second test mode and sets second test control signal tes2z to H level. As a result, the memory circuit enters second test mode.

After the memory circuit enters second test mode, it is the same as in the case of the first test mode. In other words, responsive to a read command from outside, 4-bit data from the cell array inside the memory core is outputted to the common data bus. Then, responsive to an H level of second test control signal tes2z, output activation control circuit 32A detects whether or not the outputs of common data buses cdb3 and cdb4 match. If they match, output enable signal oe1x is set to the active state (L level), while if they do not match, it is set to the inactive state (H level). In the case of a match, the output of command data bus cdb3 selected by second test control signal tes2z is outputted from first input/output terminal DQ1. In the case of a non-match, first input/output terminal DQ1 goes into the high impedance state. As a result, compressed output is outputted to first input/output terminal DQ1.

When the second test mode finishes, an exit command is supplied from outside, and second test control signal tes2z returns to L level.

In this way, in the first embodiment, first or second test mode is entered by means of a test command from outside and the corresponding compressed test output is outputted to input/output terminal DQ1.

In the case that, for example, two or more M groups of L-bit output are each compressed, test modes from first through Mth will exist. In that case, responsive to first through Mth test commands, first through Mth test control signals will be controlled to go into the active state sequentially. Then, M compressed test outputs are sequentially outputted from a single output terminal DQ1. Note that there are also cases where M compressed test outputs are outputted sequentially from a number of terminals fewer than M.

Second Embodiment

Figure 8:
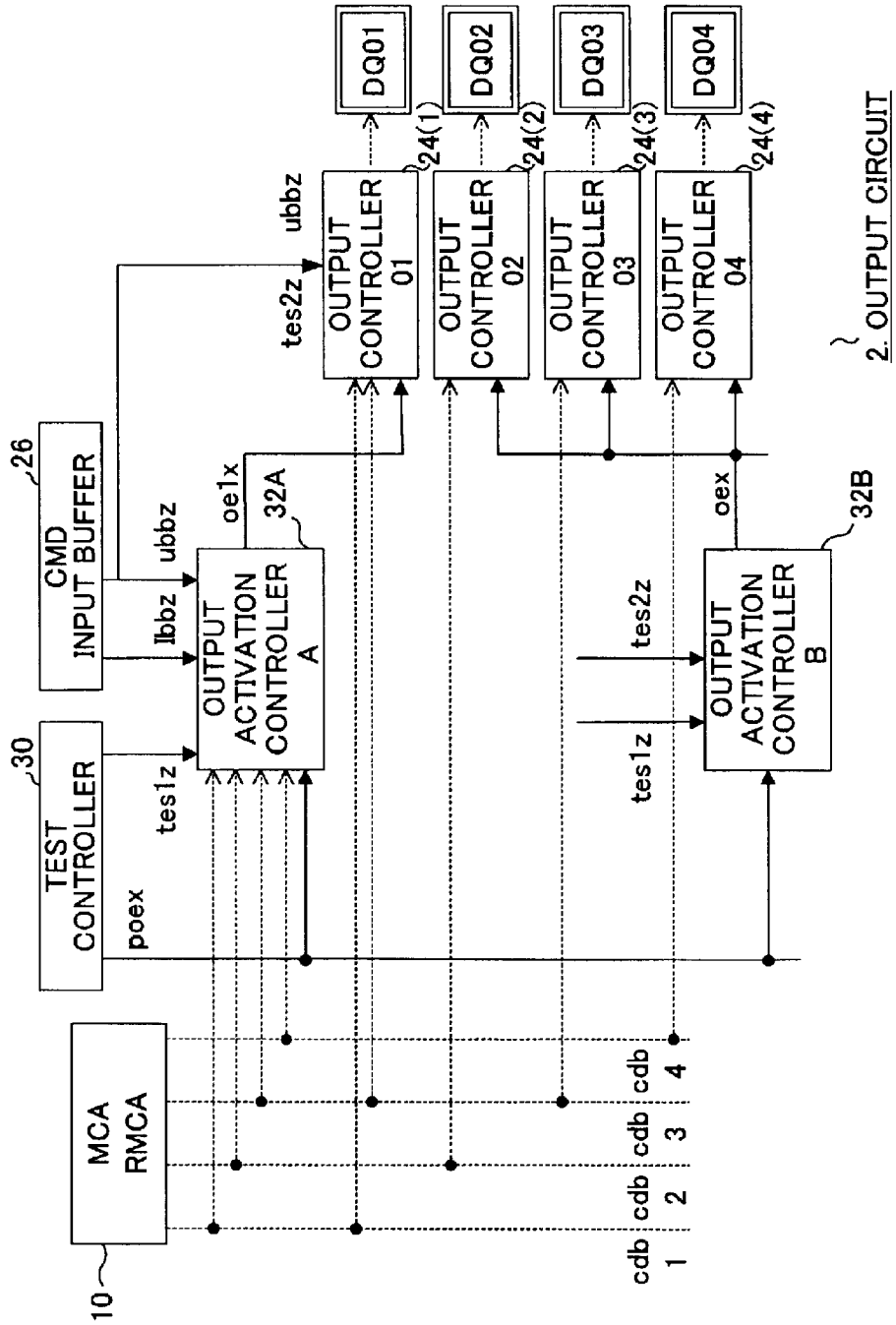
FIG. 8 is a configuration drawing of the output circuit of the second embodiment.
Figure 9:
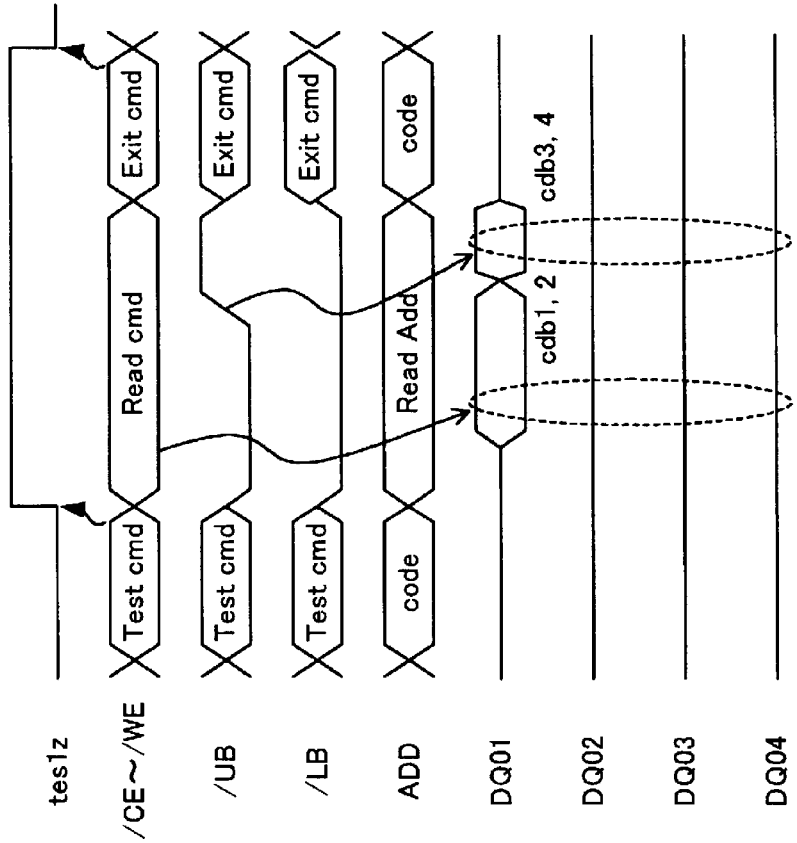
FIG. 9 is a timing chart of the test mode of the second embodiment.

FIG. 8 is a configuration drawing of the output circuit of the second embodiment, while FIG. 9 is an operation timing chart of that embodiment. With the second embodiment, test control circuit 30, responsive to test commands supplied from outside, sets test control signal tes1z to H level. As a result, it goes into the test mode. Then, selection of the two compressed test outputs is directly controlled by upper byte signal /UB. In other words, if upper byte signal /UB is at L level, the first test mode is entered and the compressed outputs of common data buses cdb1 and cdb2 are outputted to output terminal DQ1. If upper byte signal /UB goes to H level, the second test mode is entered and the compressed outputs of common data buses cdb3 and cdb4 are outputted to output terminal DQ1. For this selection of compressed test output any external signal other than the upper byte signal can be adopted as long as the external signal is not utilized as a read control command when in the test mode. Alternatively, a special external terminal not utilized in normal operation may be provided and the compressed test output selection is controlled from that terminal.

If two compressed outputs are time shared and serially outputted, an exit command is provided from outside and, responsive to that, test control circuit 30 returns test control signal tes1z to L level.

In the second embodiment, once the test mode has been entered, afterward, simply by toggling upper byte signal /UB between L level and H level, 2-bit compressed output can be outputted sequentially. Therefore, it is not necessary to enter the first and second test modes each time, by means of an external command. Also, responsive to provision of a one-time read command in the test mode, the compressed test output of output data which is read from the memory core can be outputted sequentially, just as it is, by means of upper byte signal /UB.

Consequently, because two compressed test results can be outputted for each read operation to the memory core, read operations and entry operations can be made fewer than in the case of the first embodiment, and test time can be shortened.

With the second embodiment also, by reducing the compression ratio, increasing the salvage ratio by means of redundant cell arrays, and outputting a plurality of compression test outputs sequentially, the number of memory chips which can be simultaneously measured by test equipment is increased.

As shown in the output circuit of FIG. 8, preliminary output enable signal poex, test control signal tes1z, and upper byte signal ubbz which is supplied from the external command terminal are provided to output activation control circuit 32A. In addition, preliminary output enable signal poex and test control signal tes1z are supplied to another output activation control circuit 32B.

Figure 10:
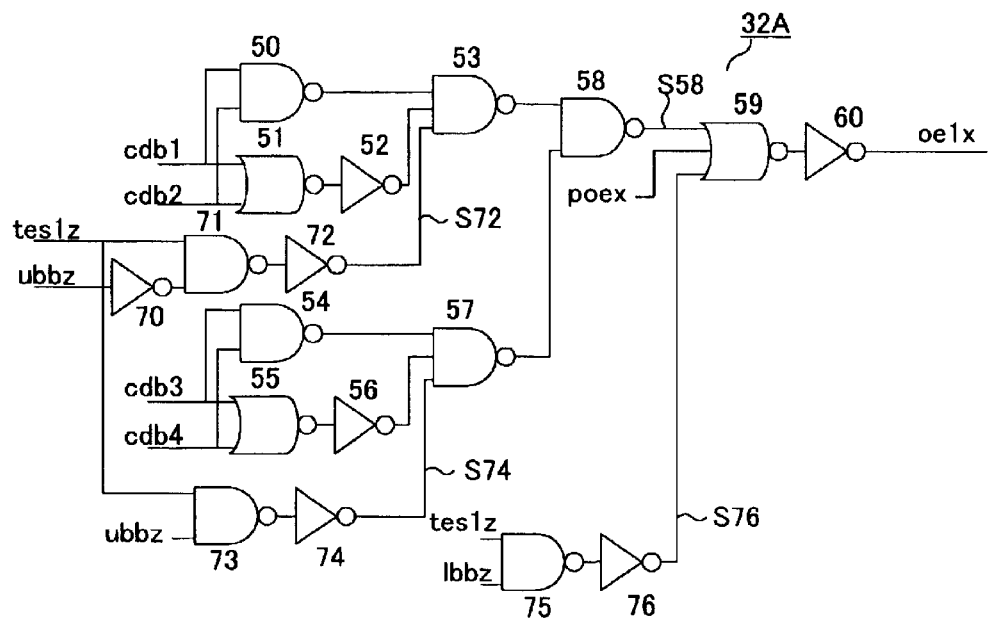
FIG. 10 is a diagram showing a circuit diagram of output activation control circuit 32A of the second embodiment.

FIG. 10 is a circuit diagram of output activation control circuit 32A. Its basic configuration is the same as the circuit of FIG. 4, shown in the first embodiment. With output activation control circuit 32A of the second embodiment, when test control signal tes1z is in the active state (H level), if upper byte signal ubbz supplied from outside is at L level, signal S72 goes to H level by means of gates 70, 71 and 72, and a decision result as to whether common data buses cdb1 and cdb2 match or not is selected. In addition, with output activation control circuit 32A, when test control signal tes1z is in the active state (H level), if upper byte signal ubbz is at H level, signal S74 goes to H level by means of gates 73 and 74, and a decision result as to whether common data buses cdb3 and cdb4 match or not is selected. In other words, signal S72 of FIG. 10 corresponds to first test control signal tes1z of FIG. 4, while signal S74 corresponds to second test control signal tes2z.

When test control signal tes1z is in the active state (H level), by means of gates 75 and 76, if lower byte signal lbbz is at H level, output activation control circuit 32A of FIG. 10, setting output enable signal oe1x to the inactive state H level), can control output DQ1 to be at high impedance. As a result, even if a plurality of memory chips is connected to the same probe of the test equipment, control can be done so that only the output of a single memory chip is in the activated state.

Figure 11:
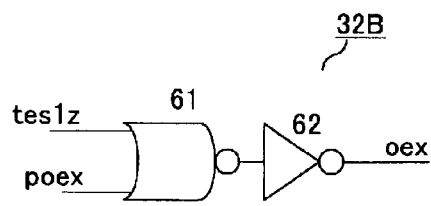
FIG. 11 is a diagram showing a circuit diagram of output activation control circuit 32B of the second embodiment.

FIG. 11 is a diagram showing a circuit diagram of output activation control circuit 32B of the second embodiment. With this output activation control circuit 32B, during normal reading, by means of an active state (L level) of preliminary output enable signal poex, the output of NOR gate 61 goes to H level, the output of inverter 62 goes to L level, and output enable signal oex goes into active state (L level). At this time, since this is not the test mode, test control signal tes1z is at L level. On the other hand, during testing, test control signal tes1z is at H level, so output enable signal oex is in the inactive state (H level). In this way, output terminals DQ2, 3, and 4 are each controlled in the high impedance state. Note that, even when not in the read mode, output enable signal oex goes into the inactive state (H level).

Figure 12:
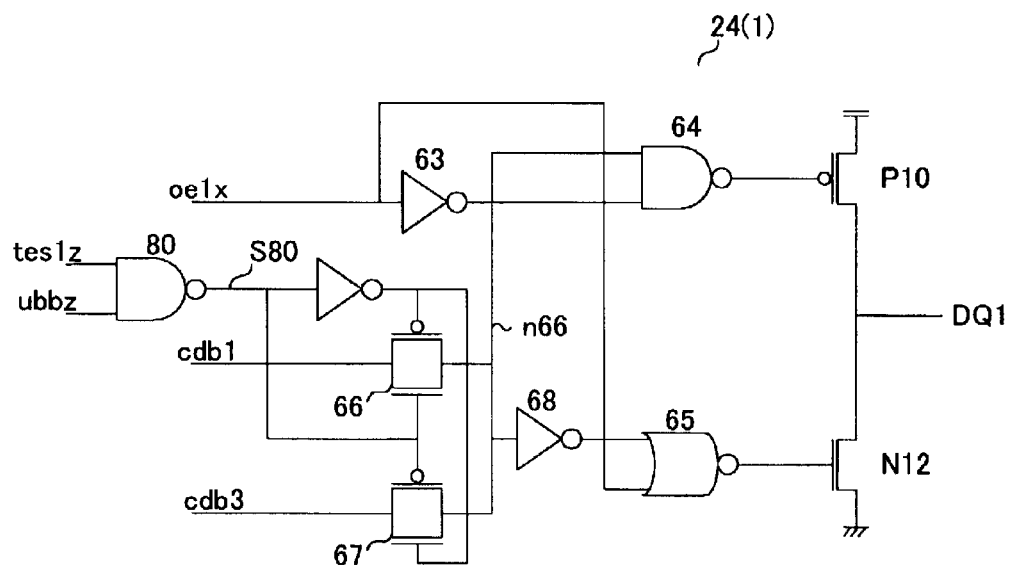
FIG. 12 is a circuit diagram of the output control circuit for the second embodiment.

FIG. 12 is a circuit diagram of the output control circuit of the second embodiment. Output control circuit 24 (1), which corresponds to first output terminal DQ1, has almost the same configuration as the output control circuit shown in FIG. 6. The single aspect which is different is that with the second embodiment, when output control circuit 24 (1) is in the test mode, responding to upper byte signal ubbz, either common data bus cdb1 or cdb3 will be appropriately selected. Therefore, when, by means of NAND gate 80, test control signal tes1z is in the active state (H level), if upper byte signal ubbz is at L level, signal S80 goes to the H level. As a result, common data bus cdb1 is selected and first compressed test output is outputted from output terminal DQ1. In addition, when test control signal tes1z is in the active state (H level), if upper byte signal ubbz is at the H level, signal S80 goes to the L level and common data bus cdb3 is selected.

As explained above, with the second embodiment, after entering the test mode due to an external command, a control signal is supplied from an external terminal command, unrelated to any operation command of the test mode, and a plurality of compressed test outputs can be partitioned by time sharing and outputted. Consequently, test time can be shortened and, together with simultaneous measurement of a plurality of memory chips by the test equipment, overall test time can be shortened.

As explained above, according to the present invention, a memory circuit is provided which, during testing, decreases the compression ratio and increases the salvage ratio through redundant cells, thus enabling simultaneous measurement by test equipment and shortened test time.

What is claimed is:

1. A memory circuit with a multi-bit output configuration comprising:

a memory core having a normal cell array and a redundant cell array, which have a plurality of memory cells;

N output terminals which respectively output N-bit output read out from said memory core;

an output circuit provided between said output terminals and memory core, which detects whether each L-bit output of the N-bit output (N=L×M) read out from said memory core matches or not and outputs a compressed output which becomes the output data in the event of a match, while becomes a third state in the event of a non-match, to a first output terminal of said N output terminals; and a test control circuit which, responding to each of a plurality of test commands, enters each one of test modes which cause said output circuit to output said compressed output for the L-bit output of a group corresponding to the test command among said M-groups of L-bit output;

wherein M blocks of compressed output are outputted in time-shared from said output control circuit.

2. A memory circuit with a multi-bit output configuration comprising:

a memory core having a normal cell array and a redundant cell array, which have a plurality of memory cells;

N output terminals which respectively output N-bit output read out from said memory core;

an output circuit provided between said output terminals and memory core, which detects whether each L-bit output of the N-bit output (N=L×M) read out from said memory core matches or not, and, outputs a compressed output which becomes the output data in the event of a match, while becomes a third state in the event of a non-match, to a first output terminal of said N output terminals;

a test control circuit which, responding to a test command, enters a test mode and, responding to test control signals of the external terminals, causes said output circuit to output said compressed output for the L-bit output of a group corresponding to said test control signal among said M groups of L-bit output;

wherein M blocks of compressed output are outputted in time-shared from said output control circuit.

3. The memory circuit according to claim 1 or 2, wherein said output circuit comprises:

N output control circuits provided in front of each of said output terminals; and an output activation control circuit which detects whether or not each of said L-bit outputs matches and controls said first output control circuit to output said compressed output.

4. The memory circuit according to claim 1 or 2, wherein said output circuit comprises:

N output control circuits provided in front of each of said output terminals; and an output activation control circuit which, during normal read operation, supplies an output enable signal to said N output control circuits to control said N output control circuits in an "output enabled" state where the N-bit output read out from said memory core can be outputted.

5. The memory circuit according to claim 4, wherein said output activation control circuit detects whether or not there is a match of each of the said L-bit outputs and causes said first output control circuit to output said compressed output.

6. The memory circuit according to claim 1, wherein said test control circuit, responding to first test command, enters a first test mode; responding to a read command, causes said output circuit to output first group of compressed output; responding to an exit command, exits from said first test mode; responding to second test command, enters a second test mode; responding to a read command, causes said output circuit to output a second group of compressed output; and, responding to an exit command, exits from said second test mode.

7. The memory circuit according to claim 2, wherein the external terminal to which said test control signal is supplied is an external terminal which is not used by read commands in that test mode.

8. The memory circuit according to claim 2, wherein said test control circuit, after entering the test mode in response to said test command, causes said output circuit to output said compressed output of L-bit output of a group corresponding to said test control signal, while in a state where, in response to a read command, the test control circuit has caused N-bit data to be outputted from said memory core.

9. The memory circuit according to claim 1 or 2, wherein said output circuit, when in said test mode, controls external output terminals other than said first output terminal among said N output terminals, to be in said third state.

10. The memory circuit according to claim 2, wherein said output circuit, in response to an output control signal supplied to a second external terminal, controls said first output terminal to be in said third state.

11. The memory circuit according to claim 1 or 2, wherein, when said third state of compressed output is detected, L-bit cells of the normal cell array are replaced by L-bit cells of said redundant cell array.

12. A memory circuit with a multi-bit output configuration comprising:

a memory core having a normal cell array and a redundant cell array, which have a plurality of memory cells;

N output terminals which respectively output N-bit output read out from said memory core;

an output circuit provided between said output terminals and memory core, which detects whether each L-bit output of the N-bit output (N=L×M) read out from said memory core matches or not and outputs a compressed output which becomes the output data in the event of a match, while becomes a third state in the event of a non-match, to a first output terminal of said N output terminals; and a test control circuit which enters each one of test modes which cause said output circuit to output said compressed output for the L-bit output of a group corresponding to the test mode among said M-groups of L-bit output;

wherein M blocks of compressed output are outputted in time-shared from said output control circuit.

* * * * *